US012438249B2

(12) United States Patent
Sakr et al.

(10) Patent No.: US 12,438,249 B2
(45) Date of Patent: Oct. 7, 2025

(54) DYADIC RADIAL COUPLER

(71) Applicant: Analog Devices International Unlimited Company, Limerick (IE)

(72) Inventors: Ahmed Sakr, Cairo (EG); Islam A. Eshrah, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 77 days.

(21) Appl. No.: 17/986,824

(22) Filed: Nov. 14, 2022

(65) Prior Publication Data

US 2023/0155270 A1 May 18, 2023

Related U.S. Application Data

(60) Provisional application No. 63/279,602, filed on Nov. 15, 2021.

(51) Int. Cl.

*H01P 5/08* (2006.01)
*H01P 3/00* (2006.01)
*H01Q 1/48* (2006.01)
*H01Q 9/04* (2006.01)
*H05K 1/02* (2006.01)

(52) U.S. Cl.

CPC .............. *H01P 5/085* (2013.01); *H01P 3/003* (2013.01); *H01Q 1/48* (2013.01); *H01Q 9/0407* (2013.01); *H05K 1/0243* (2013.01)

(58) Field of Classification Search

CPC .... H01P 5/085; H01P 5/00; H01P 5/02; H01P 5/028; H01P 5/08

See application file for complete search history.

(56) References Cited

FOREIGN PATENT DOCUMENTS

JP 201672818 A * 5/2016 ................ H01P 5/02

* cited by examiner

*Primary Examiner* — Stephen E. Jones

(74) *Attorney, Agent, or Firm* — Knobbe, Martens, Olson & Bear, LLP

(57) ABSTRACT

A two-port dyadic radial coupler for RF communications between PCB layers is disclosed. The coupler includes an input port, an impedance matching transformer, a coaxial conductor, and at least one coupled port. The input or coupled port has an at least partially annular conducting strip axially aligned with the coaxial conductor, causing radial coupling excitation by an RF signal to couple the signal between the input port and coupled port. The coupler is configured for coupling of RF signals within a select frequency range at 0 dB attenuation. In other embodiments, the coupler is configured for frequency-selective coupling to attenuate undesired frequencies. In various embodiments, the RF signal is parasitically coupled to a plurality of coupled ports on intermediate layers of the PCB. In additional embodiments, the coupled port may be left disconnected from additional circuit elements, causing the coupler to act as an antenna.

20 Claims, 8 Drawing Sheets

300

720
730
880
130
670
740
710
810

DYADIC RADIAL COUPLER

CROSS-REFERENCE TO RELATED APPLICATIONS

The present application claims priority to U.S. Provisional Patent Application No. 63/279,602, filed Nov. 15, 2021, and titled "DYADIC RADIAL COUPLER," the entirety of which is hereby incorporated herein by reference.

BACKGROUND OF THE INVENTION

Field of the Invention

The invention generally relates to the field of communications, particularly radio frequency couplings.

Description of the Related Art

Radio frequency (RF) couplers can be used to carry RF signals from one point in a circuit to another with minimal losses, such as between layers of a printed circuit board (PCB). RF signals can have a frequency in the range from about 450 MHz to about 90 GHz for certain communication standards.

RF couplers commonly use parallel-line or planar transmission lines to carry the RF signals. A conventional RF coupler is a four-port device that consists of two adjacent RF transmission lines of sufficient length to couple the RF signal from one transmission line to the other. However, the length and number of ports make it difficult to integrate existing RF couplers into a crowded PCB layout.

SUMMARY OF THE INVENTION

In certain embodiments, the present disclosure relates to a dyadic radial coupler for coupling RF signals between PCB layers. The dyadic radial coupler includes an input port comprising a transmission line on an input layer of a PCB, a coaxial conductor, an end of the conductor operatively connected to the transmission line, a coupled port located at an opposite end of the coaxial conductor; and an impedance transformer integrated within the transmission line of the input port, wherein the input layer transmission line includes an at least partially annular conducting strip on the input layer of the PCB such that coaxial coupling of an RF signal is achieved between the input port and the coupled port. The dyadic radial coupler can further include wherein the coupled port is included in a transmission line on a coupled layer of the PCB and the coupled layer transmission line includes an at least partially annular conducting strip.

In various embodiments, the input layer transmission line or coupled layer transmission line is a transmission line. The dyadic radial coupler can further include an impedance transformer integral to the coupled layer transmission line. In some embodiments, the coupler is configured to operate at microwave frequencies. The coupler can be configured to have about 0 dB of signal attenuation for coupled RF signals in a predetermined frequency band.

In other embodiments, the dyadic radial coupler is a frequency selective coupler to attenuate signals in an undesired frequency range. The at least partially annular conducting strip on the input layer of the PCB or an at least partially annular conducting strip on the coupled layer of the PCB can be substantially circular, elliptical, parabolic, or hyperbolic for improved RF signal excitation of the coupler. In the preferred embodiment, the conducting strip is substantially a ring.

In a number of embodiments, the dyadic radial coupler has a plurality of coupled ports on various intermediate layers of the PCB for propagation of the RF signal by way of parasitic coupling. The coupler can have a through port and a coupled port on each intermediate PCB layer for parasitic coupling excitation by the RF signal.

In another embodiment, the coupled port is disconnected from additional circuit elements to allow the RF signal to radiate into free space. The dyadic radial coupler can include a microstrip patch and at least one ground plane on a PCB layer, causing the coupler to act as an antenna for the RF signal. In yet another embodiment, a plurality of couplers are connected together to form an antenna array having a common ground plane.

DETAILED DESCRIPTION OF THE PREFERRED EMBODIMENT

Figure 1A:
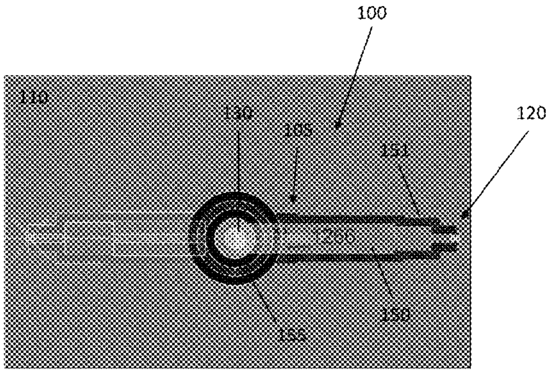
FIG. 1A is a schematic representation of an input port in one embodiment of a dyadic radial coupler.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Referring initially to FIG. 1A, an example of a dyadic radial coupler (DRC) is shown generally at 100. An input layer stripline feed 105 is disposed on an input layer 110 of a printed circuit board (PCB). The stripline feed 105 can be formed by etching, photo-lithography, or any other method known to one skilled in the art. In various embodiments, the input layer stripline feed 105 can be a microstrip feed, slotline feed, finline feed, imageline feed, waveguide, or any other type of transmission line known to one skilled in the art. The DRC 100 includes an input port 120, which is included in the input layer stripline feed 105, for connecting to a signal source, an input stage, or another component of an RF circuit configured to supply the DRC with an RF signal. The input port 120 is operably connected to an impedance matching transformer 150 for impedance matching and signal conditioning of the RF signal received by the input port. The impedance matching transformer 150 comprises a substantially rectangular portion of the stripline feed 105. As will be described in detail herein, in certain embodiments, the dimensions of the matching transformer 150 are selected to improve coupling of RF signal components at desired frequencies. In some embodiments, the stripline feed 105 can further include a tapered portion 151 located between the matching transformer 150 and the input port 120. In other embodiments, an end of the impedance matching transformer 150 connects directly to the input port 120.

An end of the matching transformer 150 opposite from the input port operably connects the matching transformer to a coaxial conductor 130. The coaxial conductor 130 couples RF signals between different layers of the PCB after impedance matching and signal conditioning is performed by the matching transformer 150. An at least partially annular conducting strip 155 surrounds the coaxial conductor 130 except where the conductor contacts the input layer stripline feed 105. A radius of the conducting strip 155 is selected to enhance coupling of the RF signal components at desired frequencies based upon the dimensions of the coaxial conductor 130 and impedance matching transformer 150. The at least partially annular conducting strip 155 can also serve to isolate the dyadic radial coupler 100 from RF emissions by nearby circuit components.

Figure 1B:
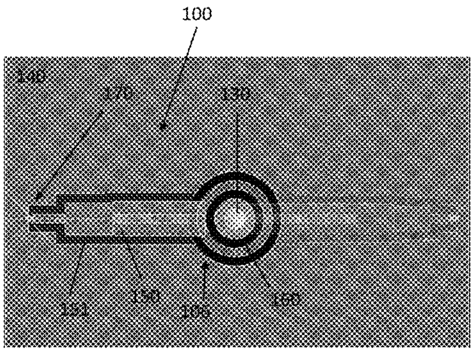
FIG. 1B is a schematic representation of a coupled port in one embodiment of the dyadic radial coupler.

FIG. 1B shows the DRC 100 of FIG. 1A from an opposite end of the coaxial conductor 130. A coupled layer of the PCB 140 has a coupled layer stripline feed 106 which receives coupled RF signal components through the coaxial conductor 130. In various embodiments, the coupled layer stripline feed 106 can be a microstrip feed, slotline feed, finline feed, imageline feed, waveguide, or any other type of transmission line known to one skilled in the art. The coupled layer stripline feed 106 can be formed by any of the same methods as the input layer stripline feed 105. The coupled layer stripline feed 106 includes an at least partially annular conducting strip 160 which is concentric with the coaxial conductor 130. In some embodiments, the annular conducting strip 160 may comprise substantially a ring that separates the stripline feed 106 from a central conductor of the coaxial conductor 130. The at least partially annular conducting strip 160 couples RF signals from the coaxial conductor 130, which are extracted from the conducting strip by the coupled layer stripline feed 106.

The coupled layer stripline feed 106 further includes an impedance matching transformer 150, which in certain embodiments may be identical to the impedance matching transformer of the input layer stripline feed 105. In other embodiments, the dimensions of the matching transformer 150 may be selected to improve coupling of specific RF frequencies, or to reduce the surface area of the DRC 100 on the input PCB layer 110 or coupled PCB layer 140. The impedance matching transformer 150 is operatively connected to an output port 170, which is also included at least partially in the coupled layer stripline feed 106, for coupling the RF signal to another part of a circuit on the coupled PCB layer 140. In some embodiments, the stripline feed 106 can further include a tapered portion 151 located between the matching transformer 150 and the input port 170. The impedance matching transformer 150 and tapered portion 151 on the coupled layer 140 can be substantially the same as those on the input layer 110, or can be selected for improved signal conditioning on the coupled layer.

0 dB Coupling Embodiment

Figure 2:
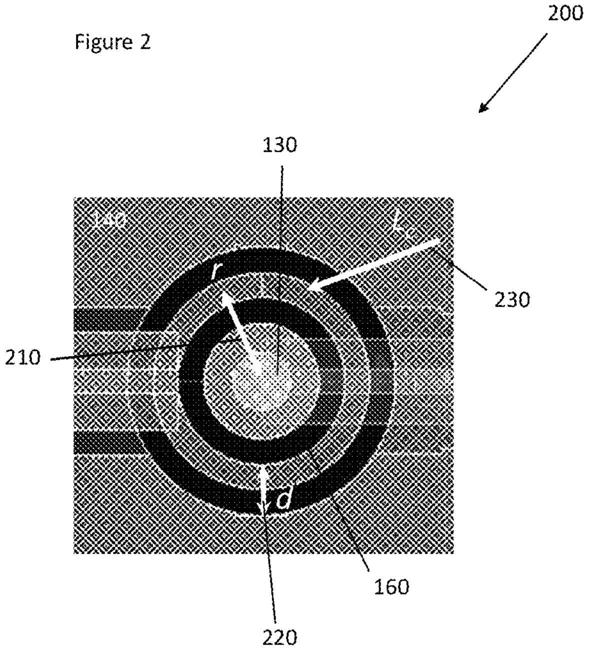
FIG. 2 is a schematic representation of a coupled layer stripline feed of the dyadic radial coupler illustrating various dimensions of the stripline feed.

Referring now to FIG. 2, the coupled layer stripline feed 106 and at least partially annular conducting strip 160 are shown in detail. Beginning from where an end of the central conductor of the coaxial conductor 130 contacts the coupled PCB layer 140, a radius (r) 210 is measured to an outer edge of the stripline feed 106 that is equal to or greater than the radius of the coaxial conductor 130. A radial difference (d) 220 is measured from an outer radius of the at least partially annular conducting strip 160 to the edge of a via on the coupled PCB layer 140 that surrounds the stripline feed 106.

In one embodiment, the radius 210 is selected to match a maximum coupled length (La) 230 of the DRC 100 for coupling RF signals with approximately 0 dB of loss. In the 0 dB coupling embodiment, the DRC 100 is configured to couple RF signal components within a desired frequency range with minimal loss. To achieve 0 dB coupling, the radius (r) 210 is determined based on a coupled length (La) 230 selected to couple the desired frequencies, where (r) is given by Equation 1 and Equation 2 below and $\beta_{even}/\beta_{odd}$ are the phase delays of even and odd components of the coupled RF signal.

$$L_c = 2\pi r = \frac{\pi}{\beta_{even} - \beta_{odd}} \qquad \text{Equation 1}$$

$$2r(\beta_{even} - \beta_{odd}) = 1 \qquad \text{Equation 2}$$

Figure 3:
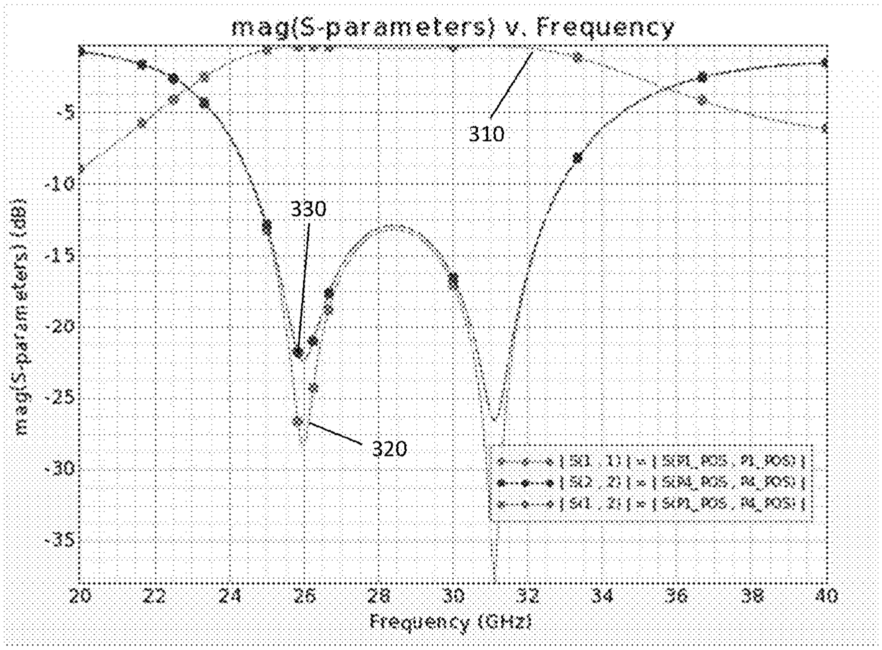
FIG. 3 is a graph of signal attenuation through a dyadic radial coupler for a range of RF signal frequencies.

FIG. 3 illustrates signal attenuation in coupled RF signals over a range of frequencies for one embodiment of the DRC 100. A graph of signal loss measured by scattering parameters (S-parameters) over a frequency range of 20 to 40 GHz is indicated generally at 300. Signal loss in the 0 dB coupling embodiment of the DRC 100 is shown at 310, with minimal losses between approximately 25 and 31 GHz. However, the dimensions of various elements of the DRC 100 (such as, the impedance matching transformer 150, at least partially annular conducting strip 130, and tapered portion 151) can be selected to achieve approximately 0 dB coupling for an arbitrary range of frequencies of interest. For example, the DRC 100 can be configured to couple specific RF bands in a communications device where unwanted RF noise is present.

Figure 5:
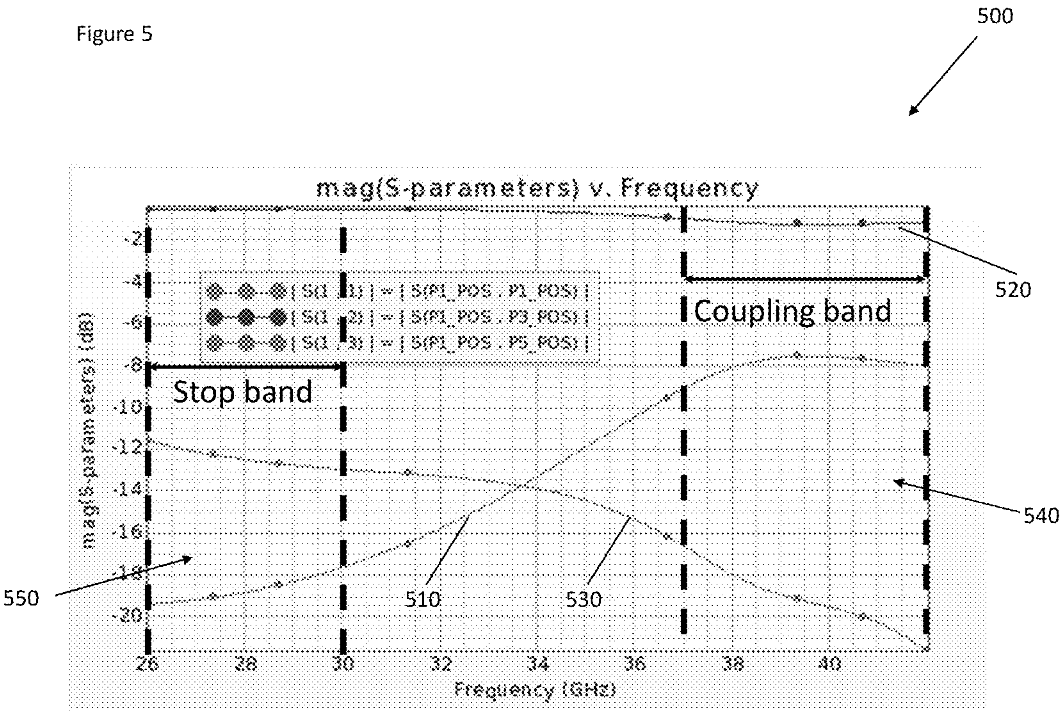
FIG. 5 is a graph of signal attenuation through a frequency-selective dyadic radial coupler for a range of RF signal frequencies.

Return losses 320/330 measured from the input port 120 and coupled port 170 are also illustrated in FIG. 5. Both return losses 320/330 exhibit band stop filter behavior, attenuating the RF signal components at approximately 26 and 31 GHz.

Although FIG. 3 illustrates one example of signal attenuation for a DRC 100, other results are possible, including results that depend on implementation, application, and/or processing technology.

Parasitic Coupling Embodiment

Figure 4A:
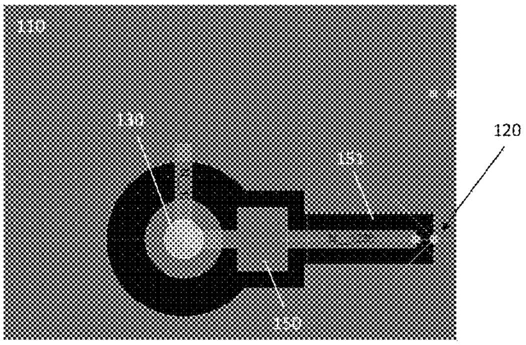
FIG. 4A is a schematic representation of an input port of a frequency-selective dyadic radial coupler.
Figure 4B:
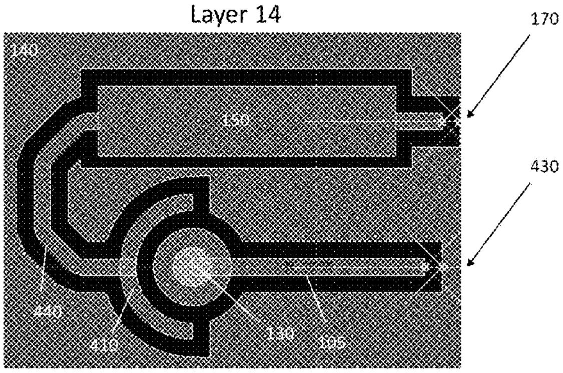
FIG. 4B is a schematic representation of a through port and a coupled port of a frequency-selective dyadic radial coupler.

Referring now to FIGS. 4A and 4B, a second embodiment of the DRC 100 is shown for frequency-selective coupling of RF signals. In FIG. 4A, the tapered portion 151 of the input layer stripline feed 105 is elongated to guide RF signals from the input port 120 across the PCB 110 and into the impedance matching transformer 150. The impedance matching transformer is advantageously configured for signal conditioning and filtering to attenuate components of the RF signal outside a predetermined pass band. The pass band may also be referred to as a coupling band because the DRC 100 couples only those signals falling within a chosen frequency range. One of skill in the art will conceive of various other embodiments of the of the DRC 100 to selectively couple various coupling bands of interest.

In FIG. 4B, a coupled layer of the PCB 140 is shown to have a second input port 430 (in some embodiments, the second input port 430 can act as a through port) which is operatively connected to the central conductor of the coaxial conductor 130 by way of the coupled layer stripline feed 105. The coupled layer stripline feed 105 is elongated similarly to the tapered portion 151 of the input layer 110 to guide the RF signal across the PCB to the through port 430. Advantageously, the RF signal may not pass through a signal conditioning or filtering stage between the coaxial conductor 130 and the through port 430, which allows the same RF signal to coupled directly into a second DRC 100 and propagate to multiple PCB layers simultaneously. The through port 430 of a first DRC 100 can be connected to an input port 120 of a second DRC 100 to achieve coupling of the RF signal to an arbitrary number of coupled ports on various PCB layers.

Adjacent to the coaxial conductor 130, a parasitic coupler 410 is provided on the coupled layer 140 to parasitically couple the RF signal as it passes between the coaxial conductor 130 and the through port 430. In the preferred embodiment, the parasitic coupler 410 is substantially a half-ring axially aligned with the coaxial coupler 130 and separated by a partially annular conducting strip in the via. In various embodiments, the parasitic coupler 410 can be substantially parabolic, hyperbolic, circular, or elliptical, the dimensions of the coupler determined by the desired level of coupling and chosen coupled frequencies. In certain embodiments, the parasitic coupler 410 can be substantially a straight microstrip or stripline segment that terminates at an edge of the via adjacent to the coaxial conductor 130. In the preferred embodiment, the parasitic coupler 410 attenuates the RF signal by approximately 7.5 dB as the signal is extracted from the coaxial conductor 130. To reduce the surface area of the DRC 100 on the PCB, the parasitic coupler 140 can be formed at a lesser angle relative to the central conductor at the expense of greater signal attenuation. Conversely, the parasitic coupler 140 can be made substantially a ring to envelop the conductor and increase the level of coupling.

A parasitic stripline 440 operatively connects the parasitic coupler 410 to a matching transformer 150 for filtering and signal conditioning of the parasitically coupled RF signal. In the preferred embodiment, the parasitic stripline 440 forms a curve to reduce the length of the DRC 100 on the coupled layer 140 of the PCB. The curvature of the parasitic stripline 440 is selected to mitigate reflections or attenuation of the coupled RF signal. In alternate embodiments, the parasitic stripline 440 can be either substantially straight or otherwise nonlinear to accommodate nearby components on the coupled layer 140 of the PCB. The matching transformer 150 performs additional signal conditioning and filtering before the RF signal is coupled to the coupled port 170. The parasitic coupler 410, parasitic stripline 440, impedance matching transformer 150, and coupled port 170 can be duplicated on a plurality of coupled layers 140 of the PCB to parasitically couple the RF signal from the coaxial conductor 130. This parallelization allows the RF signal to propagate simultaneously across intermediate layers of the PCB between the input layer 110 and a final coupled layer 140 without sacrificing performance of the DRC 100.

FIG. 5 illustrates attenuation of coupled RF signals over a range of frequencies for a frequency-selective embodiment of the DRC 100. A graph of signal loss measured by scattering parameters (S-parameters) over a frequency range of 26 to 42 GHz is indicated generally at 500. Signal loss for the 7.5 dB coupling embodiment of the DRC 100 is shown at 510, with a coupling band 540 having minimal attenuation of the RF signal between about 37 and 42 GHz. In the pictured embodiment, the DRC 100 attenuates signals in the coupling band by approximately 7.5 dB and attenuates signals in a stop band 550 from about 26 to 30 GHz by 18 dB or more. Between the coupling band 540 and the stop band 550, a transition region exists where lower frequency components of the RF signal are gradually attenuated until the frequencies enter the stop band 550. The performance curve 510 of the pictured embodiment resembles a high-pass filter, but the dimensions of the DRC 100 can be adjusted to include an arbitrary range of frequencies in coupling band 540. Likewise, the DRC can be configured to include an arbitrary range of unwanted frequencies in the stop band 550.

Attenuation of a through signal 520, measured at a through port 430, and return loss 530 are also illustrated in FIG. 5. The through signal 520 shows slight losses in the coupling band 540 because a portion of the signal is lost to the coupled port 170. The return loss 530 remains at less than −10 dB through both the coupling band 540 and stop band 550.

Although FIG. 5 illustrates one example of signal attenuation for a DRC 100, other results are possible, including results that depend on implementation, application, and/or processing technology.

Figure 6:
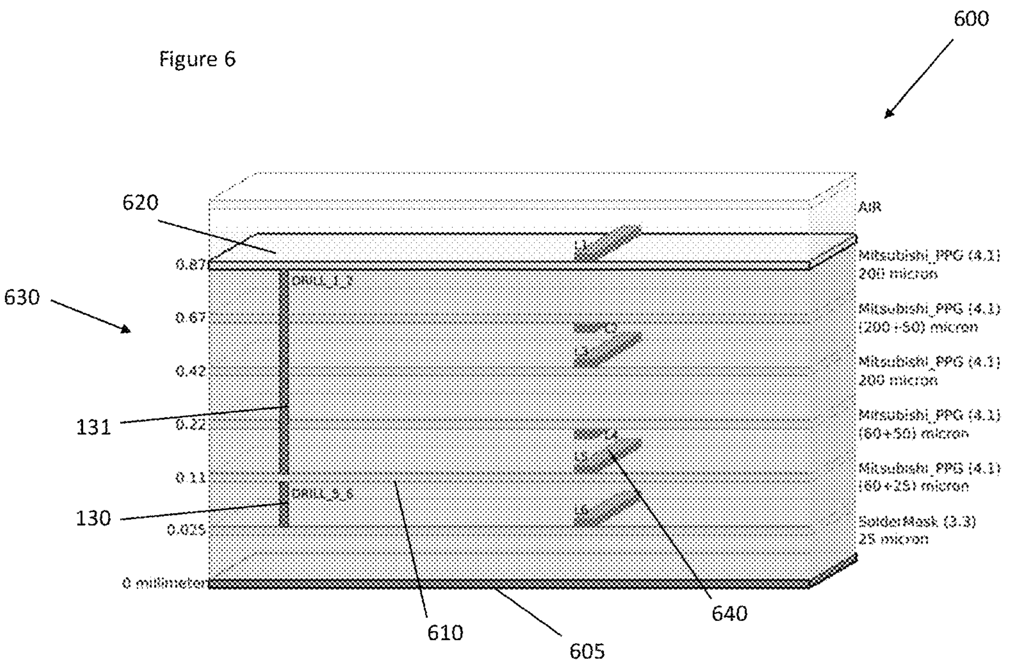
FIG. 6 is a sectional view of a plurality of PCB layers connected by a dyadic radial coupler.

FIG. 6 shows various intermediate layers 630 of a PCB 600 that are coupled by a DRC 100. An input layer 610 of the PCB 600 has an input stripline feed 640 that is operatively connected to a first coaxial conductor 130. The first coaxial conductor 130 couples an RF signal from the input stripline feed 640 to a first intermediate layer 630. In the pictured embodiment, the input layer 610 is at an elevation of approximately 0.025 mm relative to a base layer 605 of the PCB 600, and a first intermediate layer 630 is at an elevation of approximately 0.11 mm. A second coaxial conductor 131 operatively connects the first intermediate layer 630 to a coupled layer 620, the conductor 131 passing through various other intermediate layers 630 which can include coupled ports 170 for parasitic coupling of the RF signal. In the pictured embodiment, the various intermediate layers 630 are at elevations of 0.22 mm, 0.42 mm, 0.67 mm and the coupled layer is at an elevation of 0.87 mm relative to the base layer 605. Preferably each PCB layer 610, 620, and 630 has a thickness of approximately 200 microns, but the construction of the PCB 600 can be any known to one skilled in the art. Each PCB layer 610, 620, and 630 can include one or more striplines, microstrips, or other transmission lines 640 on an obverse side and a reverse side, allowing multiple embodiments of the DRC 100 to coexist on adjacent layers of the PCB 600.

Antenna Embodiment

Figure 7:
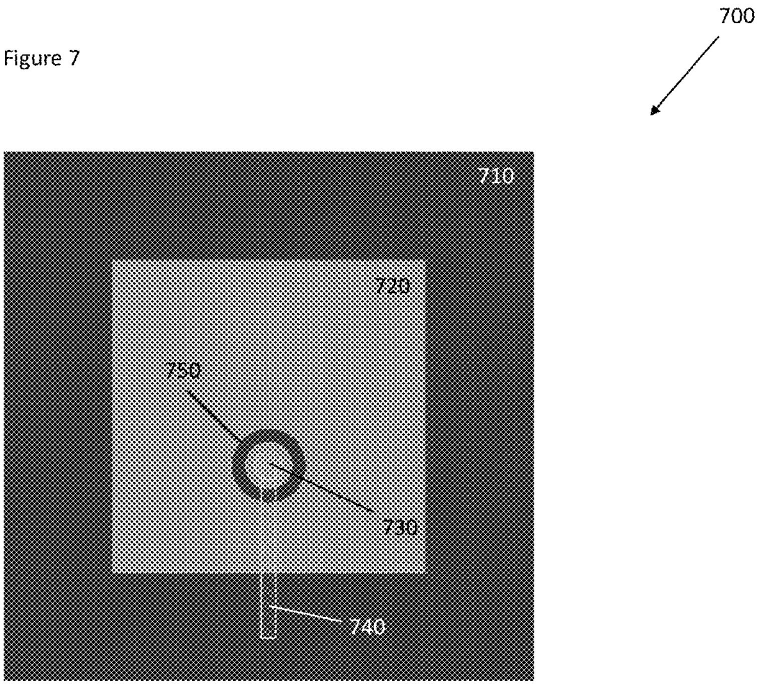
FIG. 7 is a top plan view of an antenna structure comprising an antenna embodiment of the dyadic radial coupler.
Figure 8:
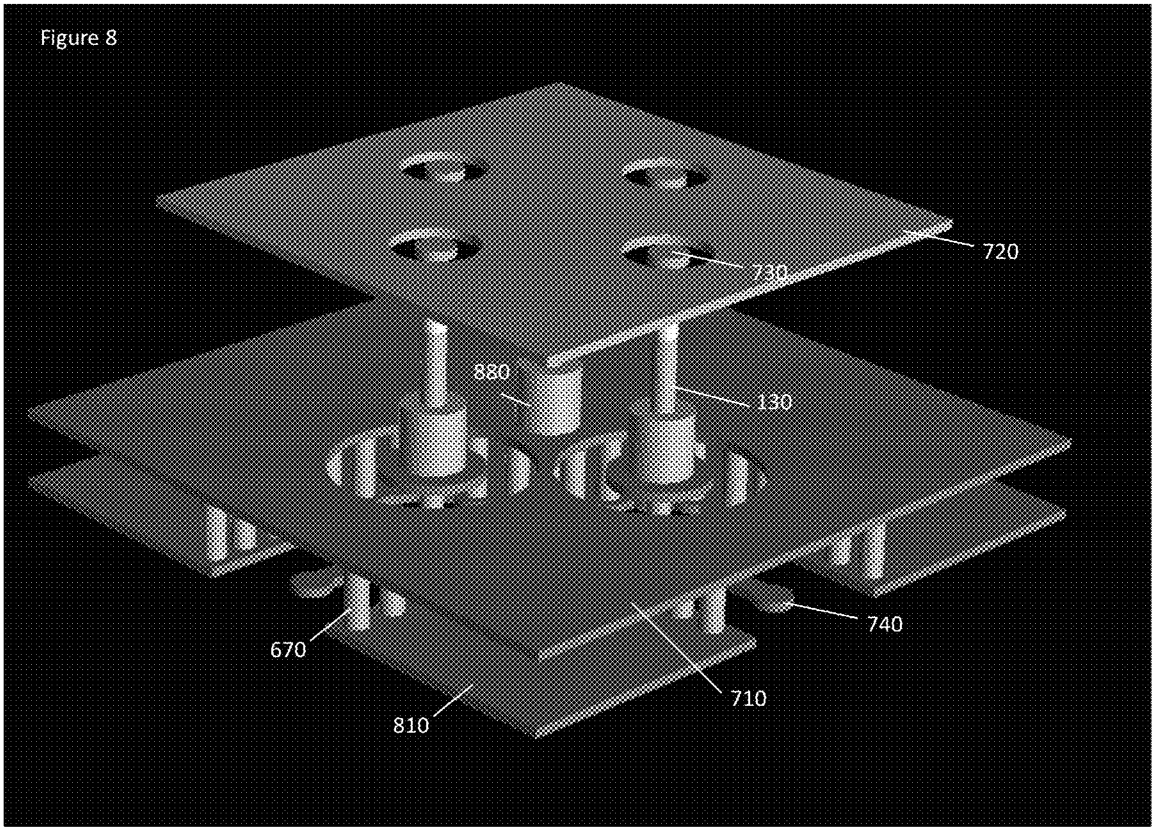
FIG. 8 is an orthographic projection of an antenna constructed according to the antenna embodiment of FIG. 7.

Referring now to FIG. 7 and FIG. 8, an antenna embodiment of the DRC 100 is shown generally at 700. In this embodiment, the coaxial conductor 130 is not connected to a coupled port 170, instead allowing the RF signal to radiate into free space from the conductor 130 acting as an antenna. The antenna embodiment of the DRC 100 advantageously allows for wireless transmission using an antenna structure that covers a compact surface area on the PCB. Multiple antenna structures can be located together in close proximity to create an antenna array for improved performance.

In an exemplary DRC 100 constructed according to the antenna embodiment, a first conductive ground layer 710 of the PCB acts as a ground plane for the antenna. The first ground layer 710 can further include a ground layer stripline feed 740 for coupling an input RF signal to the coaxial conductor 130 at one end of the conductor. Vertically above the first ground layer 610, a microstrip patch 720 exists on a separate layer of the PCB where the opposite end of the coaxial conductor 130 connects to a coaxial via feed 730 on the patch 720 which is included in an at least partially annular narrow empty region 750. The narrow empty region 750 between the coaxial via feed 730 and the rest of the microstrip patch 720 results in radial coupling excitation of the RF signal and causes the coupled signal to radiate into free space.

FIG. 8 illustrates an exemplary antenna constructed according to the principles of the present invention. In the pictured embodiment, a second ground layer 810 exists below the first ground layer 710 and includes the ground layer stripline feed 740. In the embodiment of FIG. 8, the ground layer stripline feed 740 is a stripline feed, with the first ground layer 710 acting as ground for the stripline. The second ground layer 810 is electrically connected to the first ground layer 710 by a plurality of columnar conductors 820, which are preferably arranged along edges of the second ground layer 810 surrounding the stripline feed 740. The coaxial conductor 130 connects the stripline feed 740 to the coaxial via feed 730 on the microstrip patch 720. In certain embodiments, the coaxial conductor 130 includes a shorting via 880 which connects an exterior of the conductor 130 to the first ground layer 710 to provide grounding In the exemplary antenna array, this structure is duplicated with two antennas connecting to two stripline feeds 740 oriented approximately 90 degrees from each other. Preferably, one of the stripline feeds 740 is provided for horizontal polarization of the antenna and the other stripline feed is provided for vertical polarization of the antenna. However, an antenna array can be constructed with the antenna elements arranged in any configuration known to one skilled in the art.

Applications

Devices employing the above-described schemes can be implemented into various electronic devices and multimedia communication systems. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

What is claimed is:

1. A dyadic radial coupler comprising:

an input port comprising a transmission line on an input layer of a printed circuit board (PCB), wherein the transmission line comprises a conductive portion;

a coaxial conductor, an end of the coaxial conductor operatively connected to the transmission line; and a coupled port located at an opposite end of the coaxial conductor, wherein:

the dyadic radial coupler includes an at least partially annular conducting strip at one end of the coaxial conductor such that coaxial coupling of an RF signal is achieved between the input port and the coupled port, wherein a dielectric material intervenes between the conductive portion and a central conductor of the coaxial conductor.

2. The dyadic radial coupler of claim 1, further comprising an impedance transformer integrated within the transmission line of the input port or the transmission line of the coupled layer.

3. The dyadic radial coupler of claim 1, wherein the coupler has about 0 dB of loss for coupled RF signals in a frequency range of about 25 to about 31 GHz.

4. The dyadic radial coupler of claim 1, wherein the coupled port includes a transmission line on a coupled layer of the PCB and the coupled layer transmission line includes an at least partially annular conducting strip.

5. The dyadic radial coupler of claim 4, wherein the input layer transmission line or coupled layer transmission line is a stripline feed.

6. The dyadic radial coupler of claim 4, wherein the coupled layer at least partially annular conducting strip is a complete ring.

7. The dyadic radial coupler of claim 4, wherein the coupled layer at least partially annular conducting strip is a semicircle, circular sector, or a circular segment.

8. The dyadic radial coupler of claim 4, wherein the coupled layer at least partially annular conducting strip is parabolic, hyperbolic, or elliptical.

9. The dyadic radial coupler of claim 1, wherein the coupled port is disconnected from additional circuit elements to allow an RF signal to radiate into free space.

10. The dyadic radial coupler of claim 9, further comprising a microstrip patch and at least one ground plane.

11. The dyadic radial coupler of claim 10, wherein a plurality of conductors connect a first PCB layer and a second PCB layer, both PCB layers acting as ground planes.

12. The dyadic radial coupler of claim 10, wherein a plurality of couplers are connected together to form an antenna array having a common ground plane.

13. A dyadic radial coupler comprising:
- an input port including an input layer transmission line on an input layer of a printed circuit board (PCB);
- a coaxial conductor, one end of the coaxial conductor operatively connected to the input layer transmission line; and
- a coupled port including a coupled layer transmission line on a coupled layer of the PCB, the coupled layer transmission line operatively connected to an opposite end of the coaxial conductor, wherein the input layer transmission line includes a conducting strip on the input layer of the PCB and the coupled layer transmission line includes a conducting strip on the coupled layer of the PCB such that coaxial coupling of an RF signal is achieved between the input port and the coupled port, and wherein at least the conducting strip on the coupled layer of the PCB and the coaxial conductor are separated by an intervening dielectric material.

14. The dyadic radial coupler of claim 13, further comprising a through port and a coupled port on an intermediate layer of the PCB, the through port operatively connected to the coaxial conductor and the coupled port operatively connected to a parasitic coupler such that parasitic coupling of an RF signal is achieved between the input port and the intermediate layer coupled port.

15. The dyadic radial coupler of claim 14, wherein the parasitic coupler includes a conducting strip adjacent to the coaxial conductor to achieve parasitic coupling of the RF signal.

16. The dyadic radial coupler of claim 15, wherein a nonlinear portion of an intermediate layer transmission line operatively connects the parasitic coupler to the coupled port.

17. The dyadic radial coupler of claim 15, wherein the dyadic radial coupler acts as a filter having a pass band range of about 37 to 42 GHz and a stop band range of about 26 to 30 GHz.

18. A method of constructing a dyadic radial coupler on a printed circuit board (PCB), the method comprising:
- patterning an input layer of the PCB with an input transmission line including an input port and an at least partially annular conducting strip; and
- connecting an end of a coaxial conductor to the input layer of the PCB such that the end of the conductor is at least partially enveloped by the at least partially annular conducting strip and operatively connected to the input port by way of the input transmission line, wherein the at least partially annular conducting strip and a central conductor of the coaxial conductor are separated by an intervening dielectric material.

19. The method of claim 18, further comprising:
- patterning a coupled layer of the PCB with a coupled transmission line including a coupled port and an at least partially annular conducting strip; and
- connecting an opposite end of the coaxial conductor to the coupled layer of the PCB such that the opposite end of the conductor is at least partially enveloped by the coupled layer conducting strip and operatively connected to the coupled port by way of the coupled transmission line.

20. The method of claim 18, further comprising:
- patterning an intermediate layer of the PCB with a conductive substrate to form a ground plane; and
- repeating the steps of patterning the input layer and connecting a coaxial conductor to form an antenna array with a plurality of dyadic radial couplers having a shared ground plane.

* * * * *